(12) United States Patent
Traylor et al.

(10) Patent No.: US 8,548,400 B2
(45) Date of Patent: Oct. 1, 2013

(54) SYSTEM AND METHOD FOR POLAR MODULATION USING POWER AMPLIFIER BIAS CONTROL

(75) Inventors: Kevin B. Traylor, Austin, TX (US); Richard B. Meador, Austin, TX (US); George B. Norris, Gilbert, AZ (US); David S. Peckham, Barrington Hills, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 989 days.

(21) Appl. No.: 11/445,981

(22) Filed: May 31, 2006

(65) Prior Publication Data
US 2007/0290747 A1    Dec. 20, 2007

(51) Int. Cl.
*H04B 1/04*    (2006.01)

(52) U.S. Cl.
USPC ............................ 455/110; 455/126; 375/308

(58) Field of Classification Search
USPC ................. 455/127.1, 127.2, 126, 102, 114.3, 455/108, 110; 375/308, 294, 327, 300, 302; 330/302, 307, 257, 277
See application file for complete search history.

(56) References Cited

U.S. PATENT DOCUMENTS

| | | | |
|---|---|---|---|
| 6,366,177 B1 | 4/2002 | McCune | |
| 6,670,849 B1 | 12/2003 | Damagaard | |
| 7,082,290 B2 * | 7/2006 | Takano et al. | 455/102 |
| 7,084,704 B2 * | 8/2006 | Sowlati | 330/253 |
| 7,276,985 B2 * | 10/2007 | Hirano | 332/128 |
| 7,382,182 B2 * | 6/2008 | Trocke et al. | 330/2 |
| 7,412,215 B1 * | 8/2008 | Hietala et al. | 455/126 |
| 2006/0189285 A1 * | 8/2006 | Takano et al. | 455/127.2 |
| 2006/0270366 A1 * | 11/2006 | Rozenblit et al. | 455/127.1 |
| 2007/0037530 A1 * | 2/2007 | Peckham et al. | 455/102 |
| 2007/0183531 A1 * | 8/2007 | Ahmed et al. | 375/297 |
| 2007/0264946 A1 * | 11/2007 | Rozenblit et al. | 455/127.1 |
| 2007/0264947 A1 * | 11/2007 | Rozenblit et al. | 455/127.2 |
| 2007/0275676 A1 * | 11/2007 | Rofougaran et al. | 455/127.1 |

OTHER PUBLICATIONS

Sowlati, Tirdad, Rozenblit, Dimitry, et al. Quad-Band GSM/GPRS/EDGE Polar Loop Transmitter, IEEE Journal of Solid-State Circuits, vol. 39, No. 12, Dec. 2004, pp. 2179-2189.

* cited by examiner

*Primary Examiner* — Christian Hannon
(74) *Attorney, Agent, or Firm* — Ingrassia Fisher & Lorenz, P.C.

(57) ABSTRACT

Systems and techniques are described for applying a polar bias modulation having a phase component and an amplitude component to a signal amplified by a power amplifier. The power amplifier (PA) has a plurality of amplifier gain stages and is configured to amplify an input to create an amplifier output signal. The input to the power amplitude is phase modulated based upon the phase component of the polar bias modulation, but need not be amplitude modulated. Amplitude modulation is provided by logic that includes a detector configured to receive an indication of the amplifier output as a feedback signal, a control module configured to generate a control signal based upon both the feedback signal and the amplitude component of the polar bias modulation, and a bias circuit configured to adjust a bias signal associated with at least one of the plurality of amplifier gain stages in response to the control signal. Such a modulation scheme may be readily applied in enhanced data rate for global service mode (GSM) evolution (EDGE) applications, as well as in other environments that make use of polar modulation.

19 Claims, 2 Drawing Sheets

SYSTEM AND METHOD FOR POLAR MODULATION USING POWER AMPLIFIER BIAS CONTROL

TECHNICAL FIELD

Various embodiments of the present invention generally relate to polar modulation schemes, and more particularly relate to polar modulation schemes that are at least partially applied using bias control of power amplifier gain stages.

BACKGROUND

As wireless telephones and other communications devices become increasingly powerful, a need arises to transfer information to and from such devices at faster rates. At present, many portable wireless devices contain sufficient computing power to process digital music, video and/or other media services, yet challenges remain in delivering sufficient bandwidth for such services to the device. Conventional global service mode (GSM) phones, for example, are currently limited to about 114 kbps of data throughput using the general packet radio service (GPRS) standard. While this is sufficient for general web browsing and many other applications, many consumers have expressed a desire for faster data rates.

Transmission standards for wireless data and services continue to evolve and to provide increasing throughput for emerging features and capabilities. An example of a standard that promises additional bandwidth is the "Enhanced Data Rate for GSM Evolution" (EDGE) standard, which promises data rates up to 384 kbps. Further, EDGE implementations typically make use of conventional GSM timing and signaling frames, thereby making their adoption relatively straightforward for the service provider. Frequently, emerging communications standards provide additional bandwidth by modulating transmitted signals in a manner that allows existing mechanisms to transmit additional data. The EDGE standard, for example, uses a polar modulation scheme to represent multiple data bits with conventional GPRS symbology. The addition of polar modulation therefore allows for greatly increased bandwidth, without requiring significant reworking of the underlying communications architecture.

With regard to particular telephone handsets, however, the added technical demands levied by the faster data rates can present various engineering challenges. In particular, it can be relatively difficult to control the power amplifier (PA) of the device in a manner that both precisely applies the polar modulation schemes used by EDGE and other protocols while still making efficient use of electric power supplied by the battery. Various "open loop" and "closed loop" control schemes have been developed, yet results have been varied to date. Many so-called "open loop" control schemes, for example, lack the capability to efficiently drive the power amplifier, or to respond to environmental changes such as changes in temperature. So-called "closed loop" control schemes, while effective operating the device PA, can be complicated and expensive to implement, and can themselves draw significant amounts of battery current, thereby further reducing the efficiency of such implementations.

Accordingly, it is desirable to implement systems and techniques for controlling the power amplifier of a wireless device in a manner that is effective, yet efficient. More particularly, there is a need to implement a polar modulation scheme in a power amplifier in a manner that makes efficient use of battery power, chip space and other resources. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The exemplary embodiments will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description.

According to various embodiments, systems and techniques are provided for applying a polar bias modulation having a phase component and an amplitude component to a signal amplified by a power amplifier. The power amplifier (PA) has a plurality of amplifier gain stages and is configured to amplify an input to create an amplifier output signal. The input to the power amplitude is phase modulated based upon the phase component of the polar bias modulation, but need not be amplitude modulated. Amplitude modulation is provided by logic that includes a detector configured to receive an indication of the amplifier output as a feedback signal, a control module configured to generate a control signal based upon both the feedback signal and the amplitude component of the polar bias modulation, and a bias circuit configured to adjust a bias signal associated with at least one of the plurality of amplifier gain stages in response to the control signal. Such a modulation scheme may be readily applied in EDGE applications, as well as in other environments that make use of polar modulation.

For the sake of brevity, conventional techniques related to supply voltage signal generation, transistor operation, circuit reset functions, and other functional aspects of the circuits (and the individual operating components of the circuits) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

Figure 1:
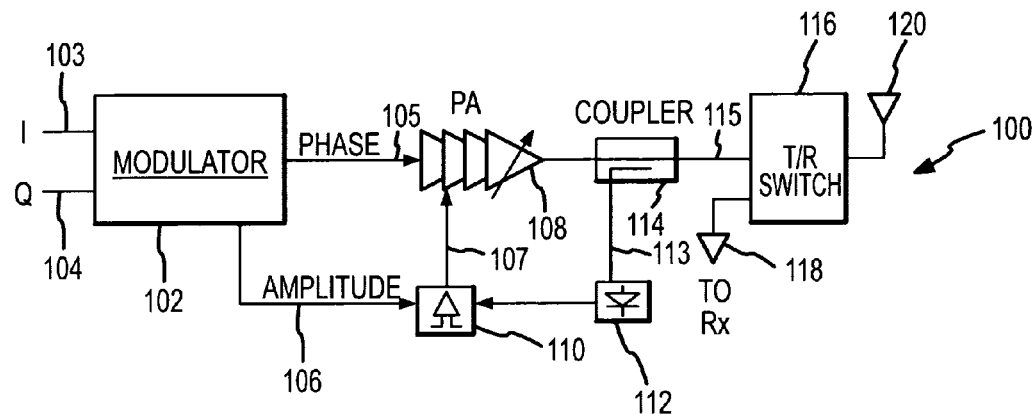
FIG. 1 is a block diagram of an exemplary amplifier system that incorporates bias control for polar modulation.

Turning now to the drawing figures and with initial reference to FIG. 1, an exemplary system 100 suitable for implementing a polar modulation scheme in a portable device includes a waveform modulator 102 that generates phase information 105 for the modulation and a power amplifier (PA) 108 that amplifies the phase information 105 in response to an amplifier bias control signal 107. The bias control signal 107 is produced as a result of amplitude modulation data 106, as well as a feedback signal 113 that is derived from output 115 of PA 108. The feedback signal 113 can be readily produced by a directional coupler 114 or the like, and can be sensed by a conventional radio frequency (RF) detector circuit 112. This feedback data can be amplified or otherwise processed in conjunction with amplitude modulation data 106 by amplifier module 110 to arrive at control signal 107. The feedback loop design can further provide a convenient mechanism for discrete loop gain adjustments, for example, and other benefits may also be available from various further embodiments.

By providing open loop phase control and closed loop amplitude control, the robustness of transmit data is preserved without incurring significant additional current demand, and without introducing undesired complexity into the device design. The output 115 of PA 108 can be readily provided to a transmit/receive switch 116 and/or otherwise provided for transmission via an antenna 120, for example. Transmit/receive switch 116 may also process receive data 118 received via antenna 120, as appropriate. Using the general system 100 of FIG. 1, then, conventional data signals 103, 104 (which can represent sine and cosine components of a modulated wave, for example) can be reliably and efficiently modulated on a carrier signal and transmitted to a recipient via antenna 120.

Figure 2:
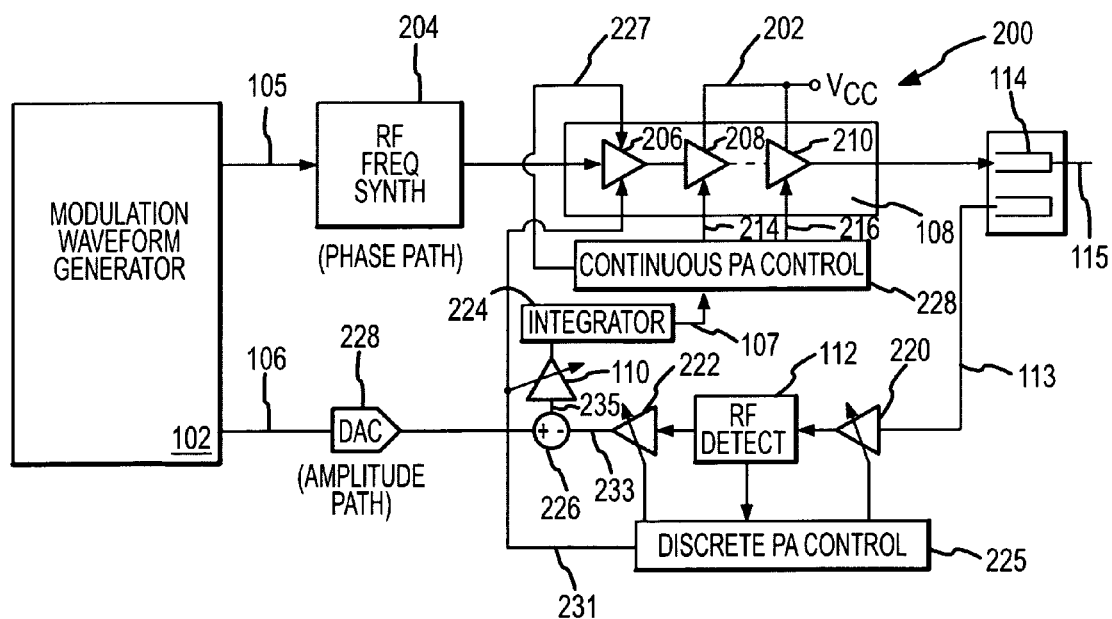
FIG. 2 is a block diagram of an exemplary analog system for applying an amplitude modulation using power amplifier bias control.

FIG. 2 shows a more detailed description of an exemplary embodiment 200 of system 100 that is implemented primarily with analog circuitry. As shown in FIG. 2, system 200 suitably includes a modulation waveform generator 102, an RF frequency synthesizer 204, a power amplifier 108 having any number of stages 206, 208, 210, and a feedback loop providing feedback signal 113 from coupler 114 to an RF detector 112. The feedback circuitry also includes gain circuitry 220, 222 to apply discrete control 225 to the feedback loop, as well as summing and integrating circuitry 226, 224 to generate an amplitude control signal 107 for a power amp control module 228. As described above, phase data 105 is provided in an open loop manner while amplitude data 106 is provided with closed loop control to provide a polar modulation scheme 200 that is effective yet efficient.

Modulation waveform generator 102 is any circuitry or logic capable of providing polar modulation signals having a phase component 105 and an amplitude component 106. Waveform generator 102 may be implemented with any type of digital control circuitry, for example, including any type of microcontroller, microprocessor, digital signal processor, programmed logic array, and/or the like. Alternatively, generating of such waveforms may be carried out in software or firmware associated with programmed digital circuitry. In still other embodiments, application specific or other custom circuitry can be designed to produce the desired phase and amplitude signals 105, 106 as appropriate. In the exemplary embodiment shown in FIG. 2, waveform generator 102 is a digital integrated circuit provided in conjunction with an RF frequency synthesizer 204 and a digital-to-analog converter (DAC) 228. In such embodiments, RF frequency synthesizer 204 converts digital control signals 105 received from waveform generator 102 to analog waveforms oscillating at the desired frequencies, while DAC 228 converts digital amplitude representations to corresponding analog signals (e.g. electrical voltage signals). Because amplitude modulation is separately applied via signal 106 in such embodiments, phase data is generally produced in raw form with a relatively unchanging amplitude that can be modulated in response to signal 106 and/or other factors as appropriate. In other embodiments, modulation generator module 102 provides modulation signals 105, 106 in raw analog form that can be processed by the rest of system 200 without additional conversion.

Power amplifier 108 is any device, module or other component capable of converting conventional digital or analog electrical to RF signals suitable for transmission on antenna 120 (FIG. 1). In various embodiments, power amplifier 108 contains two or more amplifier gain stages, shown in FIG. 2 as amplifier stages 206, 208 and 210, although other embodiments may contain any larger or smaller number of stages. In various embodiments, each amplifier stage 206, 208, 210 functions similar to a bipolar junction transistor (BJT), with amplification gain for each stage being determined by a bias applied to a collector or base junction of the transistor. In such embodiments, the bias 227, 214, 216 applied to each gain stage 206, 208, 210 (respectively) can be used to adjust or amplitude modulate the signal being amplified. In the particular embodiment shown in FIG. 2, for example, the first gain stage 206 of PA 108 receives a variable collector bias 227, whereas subsequent stages 208, 210 each receive a variable base bias 214, 216. Other embodiments, however, may apply the bias signals in any manner or combination of manners to thereby amplitude modulate the phase data 105 applied at an input of PA 108. The resulting modulated signal 115 is then provided to a transmit/receive switch 116, antenna 120 and/or the like for RF transmission.

As noted above, modulated output signal 115 can also be monitored in a feedback loop that is initiated at a conventional coupler 114. Feedback data 113 is appropriately amplified, attenuated or otherwise scaled (e.g. by variable gain amplifier 220) to increase (or maximize) the signal-to-noise ratio at RF detect circuit 112. This gain/attenuation further assists in regulating the average output power of PA 118 in that increases or decreases in the average power of feedback signal 113 can affect subsequent control signals 107 applied to the bias of PA 108.

The signal resulting from RF detector 112 can also be amplified or attenuated as desired, e.g. by variable gain amplifier 222. In various embodiments, RF detector circuit 112 provides a digital or analog input to a discrete PA control module 225 that generates appropriate control signals to adjust the gains of amplifiers 220 and/or 222. In various embodiments, the gain or attenuation between coupler 114 and detector 112 is set in increments of about 6 dB or so while the post-detector gain is set in increments of about 2 dB or so. These values allow for simple gain adjustment in relatively small increments, without requiring extensive design to perfect the linearity of PA 108. Other embodiments, however, may use widely varying values for adjusting the gain or attenuation of loop closure signals 113.

The scaled loop closure data 233 is subtracted or otherwise combined with amplitude modulation data 106 at summing junction 226. In practice, summing junction may be any active or passive summing node such as an operation amplifier (op amp), capacitor or the like. By determining the difference between the desired modulation amplitude and the scaled feedback amplitude currently produced by PA 108, the desired increase or decrease in bias can be determined and applied. To that end, the combined amplitude signal 235 is scaled as desired (e.g. by variable gain amplifier 110) and applied to an integrating circuit 224. Integrating circuit 224 is any accumulating circuitry or logic such as a feedback signal across an op amp, a capacitor or other summing junction, and/or the like. Integrator 224 therefore adjusts the gain of both the input and feedback baths to compensate for gain changes of PA 108 and feedback paths for each power step described above.

The output of integrator 224 is therefore provided to power amplifier control module 228, which appropriately scales the integrator output and/or otherwise processes that signal to produce suitable bias control signals 227, 214, 216 to be applied to the various gain stages of amplifier 108. In the embodiment shown in FIG. 2, then, two different power amplifier control modules are shown. Control module 225 appropriately applies discrete gain or attenuation steps based upon feedback signal 113 detected at RF detector 112, and control module 228 applies continuous bias signals 227, 214, 216 to gain stages 206, 208, 210. Further, discrete power steps can be applied (via signal 231) to gain scaling amplifier 110 as well as one or more gain stages 206 of amplifier 108 as appropriate. Both the discrete and continuous control modules may be implemented with any sort of digital or analog control circuitry, and/or may be implemented with programmed (e.g. software or firmware) logic in a programmable device such as a microcontroller, application specific IC or programmed logic array. Further, various digital or analog control circuitry may be provided within system 200 to further supplement the detection and signal processing features shown and described with reference to FIG. 2. A serial or parallel interface to a baseband processor, for example, could be provided to clocking signals, control data and/or the like. Using this external interface, ramping signals (e.g. power up/power down) or other effects can be readily applied to system 200.

Figure 3:
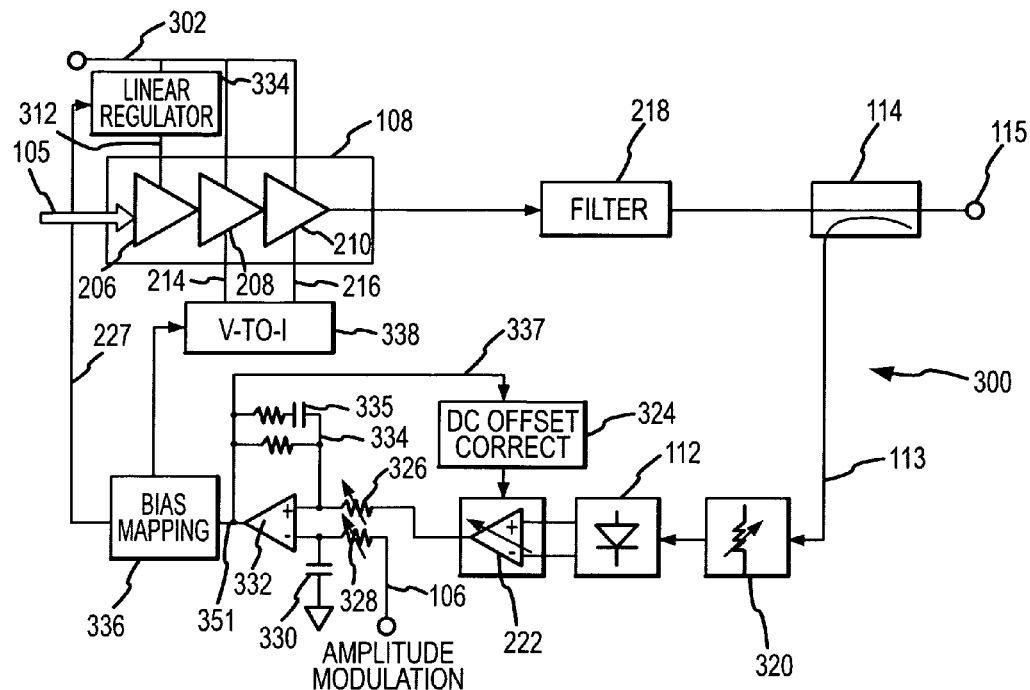
FIG. 3 is a block diagram of an exemplary system for applying an amplitude modulation using power amplifier bias control.

FIG. 3 shows a more detailed analog implementation of a polar modulating system 300. With reference now to FIG. 3, a multi-stage PA 108 suitably amplifies phase-only modulated signal 105 in response to a control voltage signal 351. The output power of PA 108 is controlled by collector bias of first stage 206, as well as base current bias of the subsequent gain stages 208, 210. PA 108 may be implemented as, for example, a conventional heterojunction bipolar transistor (HBT) amplifier using gallium arsenide, InGaP or other materials. The resulting output of the PA 108 is modified by an optional filter 218 to provide output matching, harmonic filtering and/or other features as appropriate, and is provided as output 115 to an RF switch, antenna 120 (FIG. 1) and/or the like.

Polar modulation is provided using open loop phase control in conjunction with closed loop amplitude control, as described above. Feedback signal 113 is obtained via coupler 114 as appropriate. In an exemplary embodiment, the RF output from PA 108 has a characteristic impedance of about 50 ohms or so, and coupler 114 is implemented with a conventional dual-port 17 dB coupler with a characteristic impedance of about 100 ohms or so to increase the voltage gain of system 300, although the particular characteristics of amplifier 108 and coupler 104 may vary significantly in other embodiments.

The incident power of feedback signal 113 may be detected using any suitable detector circuitry, such as a conventional linear detector 112. In various embodiments, the linear detector is implemented with one or more diodes that have an effective range of about 40 dB or so after initial gain/attenuation of signal 113. By adjusting the gain or attenuation of feedback signal 113 (e.g. using a variable resistor circuit 320, op amp, and/or the like), RF detector 112 can be kept within a desired operating range, such as in the optimal linear range (e.g. about 25 dB or so) of many conventional RF detectors 118. Again, signal 113 may be amplified/attenuated in steps of about 6 dB or so, although particular values vary by embodiment.

The feedback signal detected at RF detector 118 can then be amplified or otherwise shaped at variable gain amplifier 222 (e.g. in increments of about 2 dB or so) to apply a DC offset from module 324, to re-compensate for attenuation applied at circuit 320, and/or for other reasons (e.g. application of ramping signals and/or the like). The amplified signal is provided, via an optional variable impedance 326, to an accumulation/integration circuit that includes op amp 332 functioning as summing junction 226 (FIG. 2) and a feedback capacitor 335 functioning as integrator 224 (FIG. 2). Amplifier 332 also receives the amplitude modulation signal 106 from waveform generator 102 (FIG. 2), which is optionally filtered by variable impedance 328 and/or capacitor 330 to provide noise filtering, amplitude scaling, and/or the like. In various embodiments, the time constant of the integrator is adjusted (e.g. with variable impedances 326, 328) to compensate for the discrete power steps applied to amplifier 222 and to keep the feedback loop gain approximately constant at a frequency of interest (e.g. about 2.5 MHz or so) and over the available power range (e.g. about 4-34 dBm or so).

The control voltage 351 ($V_{apc}$) of amplifier 332 suitably represents the combined feedback and modulation control that is ultimately applied to power amplifier 108. Output voltage 351 may also be provided in raw or filtered form (shown in path 337 in FIG. 3) to a DC offset module that appropriately scales the gain on amplifier 222 to implement output power control, ramping and/or other features as appropriate. Control voltage 351 is suitably provided to an optional bias mapping circuit 336 that appropriately amplifies or otherwise scales control signal 351 prior to application to the bias control inputs of PA 108. In such embodiments, the output of bias mapping circuit 336 is provided to a voltage-to-current conversion circuit 338 capable of generating suitable base current bias signals 214, 216 for stages 208, 210. Output 227 from bias mapping circuit 336 may also be applied to a linear regulator or other suitable regulator circuit for applying a proper emitter bias voltage 312 to the initial gain stage 206 of PA 108. In various embodiments, the bias voltage applied is based upon a "battery" voltage 302 received from a power supply or the like.

Figure 4:
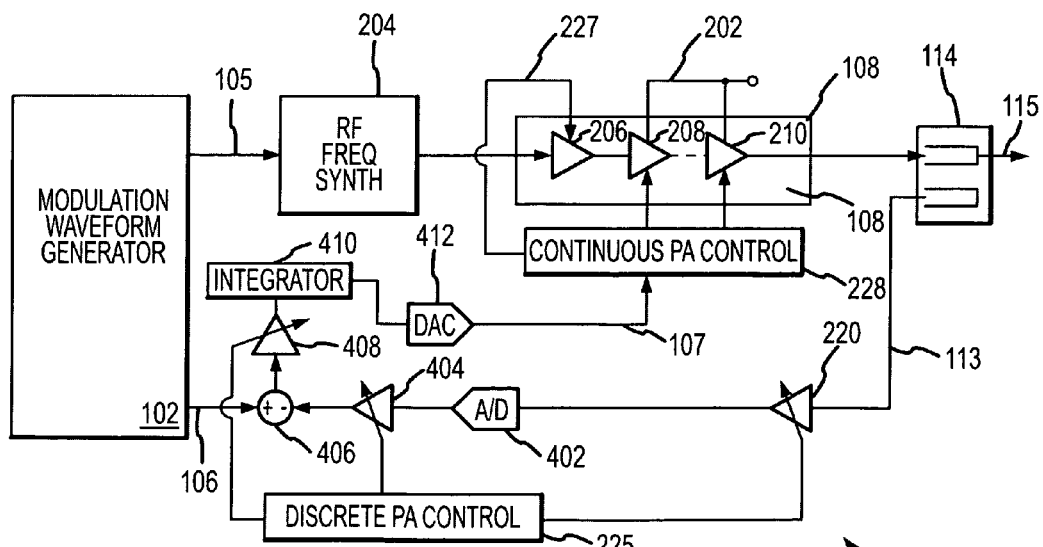
FIG. 4 is a more detailed diagram of an exemplary polar modulation scheme that incorporates power amplifier bias control for amplitude modulation.

Various changes and enhancements can be made to the various circuits shown in FIGS. 1-3. As noted above, many of the particular operating parameters (such as the size of the power gain and attenuation steps) can vary from embodiment to embodiment. Similarly, the basic features of the various circuits and systems could be implemented in many different but equivalent ways. FIG. 4, for example, shows a digital embodiment of an exemplary polar modulation scheme that uses many of the concepts described above.

With reference now to FIG. 4, an exemplary digital polar modulation system 400 suitably includes an analog-to-digital converter (A/D) 402, digital circuitry for implementing signal gains 404, 408 and other logic features, and a digital-to-analog converter (DAC) 412. In this instance, the RF feedback signal 113 received from coupler 114 is optionally scaled prior to A/D conversion by amplifier 220, and the resulting signal is digitized in any suitable manner for subsequent processing. Rather than relying upon analog op-amps, capacitors and/or other components for signal processing, the digitized values can be stored in a memory or register, and can be amplified (e.g. multiplied) by appropriate gain factors, added together using conventional digital arithmetic techniques, integrated using simple digital accumulation, and/or otherwise digitally processed as appropriate. The resulting digital value of $V_{apc}$ can then be converted to a digital equivalent 107 that is then applied to bias control circuitry for PA 108, as described above. Again, many modifications can be made to the particular implementations described herein in a wide array of alternate, but equivalent, embodiments.

Various exemplary embodiments, then, provide a system for applying a polar bias modulation having a phase component and an amplitude component to a signal. The system suitably comprises a power amplifier, a frequency synthesizer and an amplitude control circuit. The power amplifier (PA) comprises a plurality of amplifier gain stages, wherein the power amplifier is configured to amplify an input to create an amplifier output signal. The frequency synthesizer is configured to apply a phase modulation to the signal input to the power amplifier, wherein the phase modulation is based upon the phase component of the polar bias modulation. The amplitude control circuit comprises a detector configured to receive an indication of the amplifier output as a feedback signal, a control module configured to generate a control signal based upon both the feedback signal and the amplitude component of the polar bias modulation, and a bias circuit configured to adjust a bias signal associated with at least one of the plurality of amplifier gain stages in response to the control signal.

Further, such a system can be enhanced in many different ways. In various embodiments, a signal input to the power amplifier comprises a substantially uniform amplitude (e.g. an amplitude that may have some variations due to signal noise, manufacturing or design imperfections, design tolerances, and/or other factors as appropriate). In other embodiments, a baseband gain stage can be coupled to the detector and the control module and configured to adjust the feedback signal. The baseband gain stage can be configured to adjust the feedback signal based at least in part upon a signal received from a control interface, in discrete steps, or according to any other scheme.

Other embodiments comprise an integrator having a time constant, wherein the integrator is configured to combine the feedback signal and the amplitude component of the polar modulation to create the control signal. The time constant of the integrator may be adjustable to maintain a substantially constant loop gain of the feedback signal. Alternatively, the control module can comprise an integrator having a time constant, wherein the integrator is configured to combine the feedback signal and the amplitude component of the polar modulation to create the control signal, and wherein the time constant of the integrator is adjustable with the discrete steps of the baseband gain to maintain a substantially constant loop gain of the feedback signal.

In still other embodiments, the plurality of amplifier gain stages comprises a first amplifier gain stage, wherein the bias signal associated with the first stage is a collector voltage. The plurality of amplifier gain stages can further comprise a second amplifier gain stage, wherein the bias signal associated with the second amplifier gain stage is a base current. The bias circuit can comprise a voltage-to-current conversion module configured to convert the control signal to the base current of the second amplifier gain stage.

Further, an analog-to-digital converter can be coupled to receive the feedback signal and a digital-to-analog converter configured to provide the control signal to the bias circuit, wherein the control module comprises digital circuitry logically disposed between the analog-to-digital converter and the digital-to-analog converter. In other embodiments, the control module comprises an analog integrator and associated bias circuitry.

Any of the systems described above can be incorporated into any number of devices, including wireless telephone handsets, wireless telephone infrastructure equipment, personal digital assistants, portable computers, game playing devices, global positioning systems and/or any other computing or communicating devices as appropriate.

In still other embodiments, a method of applying a polar modulation having a phase component and an amplitude component to a power amplifier (PA) having an amplifier gain stage is provided. The power amplifier is configured to amplify an input to create an amplifier output signal. The method comprises the steps of receiving an indication of the amplifier output as a feedback signal, generating a control signal based upon both the feedback signal and the amplitude component of the polar bias modulation, and adjusting a bias signal associated with the amplifier gain stage in response to the control signal. This method may be enhanced in many ways. For example, various embodiments comprise the step applying a phase modulation to the signal input to the power amplifier, wherein the phase modulation is based upon the phase component of the polar bias modulation. The step of adjusting the feedback signal in discrete steps between the receiving step and the generating step may also be provided. The generating step may also comprise combining the feedback signal and the amplitude component of the polar modulation at an integrator to create the control signal, and wherein the time constant of the integrator is adjustable with the discrete steps of the baseband gain to maintain a substantially constant loop gain of the feedback signal.

Other embodiments include circuits and/or other hardware, firmware, software or other logic configured to execute any of the methods described above. Such methods may be executed by software or firmware stored in a digital memory, programmed array logic device and/or the like, and may be executed by any sort of microcontroller, microprocessor, digital signal processor and/or other programmable circuitry as appropriate.

Still other embodiments provide a system for applying a polar modulation having a phase component and an amplitude component to a power amplifier (PA) having an amplifier gain stage, wherein the power amplifier is configured to amplify an input to create an amplifier output signal. The system comprises means for receiving an indication of the amplifier output as a feedback signal, means for generating a control signal based upon both the feedback signal and the amplitude component of the polar bias modulation, and means for adjusting a bias signal associated with the amplifier gain stage in response to the control signal.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A system for applying a polar bias modulation having a phase component and an amplitude component to a signal, the system comprising:

a power amplifier (PA) having a plurality of amplifier gain stages, wherein the power amplifier is configured to amplify an input to create an amplifier output signal;

a frequency synthesizer configured to apply an open loop phase modulation to the signal input to the power amplifier, wherein the phase modulation is based upon the phase component of the polar bias modulation; and a closed loop amplitude control circuit comprising a detector configured to receive an indication of the amplifier output as a feedback signal, a control module configured to generate a control signal based upon both the feedback signal and the amplitude component of the polar bias modulation, and a bias circuit configured to adjust a bias signal associated with at least one of the plurality of amplifier gain stages in response to the control signal.

2. The system of claim 1 wherein the signal input to the power amplifier comprises a substantially uniform amplitude.

3. The system of claim 1 further comprising a baseband gain stage coupled to the detector and the control module and configured to adjust the feedback signal.

4. The system of claim 3 wherein the baseband gain stage is configured to adjust the feedback signal based at least in part upon a signal received from a control interface.

5. The system of claim 3 wherein the baseband gain stage is configured to adjust the feedback signal in discrete steps.

6. The system of claim 1 wherein the control module comprises an integrator having a time constant, wherein the integrator is configured to combine the feedback signal and the amplitude component of the polar modulation to create the control signal.

7. The system of claim 6 wherein the time constant of the integrator is adjustable to maintain a substantially constant loop gain of the feedback signal.

8. The system of claim 5 wherein the control module comprises an integrator having a time constant, wherein the integrator is configured to combine the feedback signal and the amplitude component of the polar modulation to create the control signal, and wherein the time constant of the integrator is adjustable with the discrete steps of the baseband gain to maintain a substantially constant loop gain of the feedback signal.

9. The system of claim 1 wherein the plurality of amplifier gain stages comprises a first amplifier gain stage, wherein the bias signal associated with the first stage is a collector voltage.

10. The system of claim 9 wherein the plurality of amplifier gain stages further comprises a second amplifier gain stage, wherein the bias signal associated with the second amplifier gain stage is a base current.

11. The system of claim 10 wherein the bias circuit comprises a voltage-to-current conversion module configured to convert the control signal to the base current of the second amplifier gain stage.

12. The system of claim 1 further comprising an analog-to-digital converter coupled to receive the feedback signal and a digital-to-analog converter configured to provide the control signal to the bias circuit, and wherein the control module comprises digital circuitry logically disposed between the analog-to-digital converter and the digital-to-analog converter.

13. The system of claim 1 wherein the control module comprises an analog integrator and associated bias circuitry.

14. A wireless telephone handset incorporating the system of claim 1.

15. A method of applying a polar modulation having a phase component and an amplitude component to a power amplifier (PA) having an amplifier gain stage, wherein the power amplifier is configured to amplify an input to create an amplifier output signal, the method comprising the steps of:

applying an open loop phase modulation to the signal input to the power amplifier, wherein the open loop phase modulation is based upon the phase component of the polar bias modulation;

receiving an indication of the amplifier output amplitude as a feedback signal;

generating a control signal based upon both the feedback signal and the amplitude component of the polar bias modulation; and adjusting a bias signal associated with the amplifier gain stage in response to the control signal.

16. The method of claim 15 further comprising the step of adjusting the feedback signal in discrete steps between the receiving step and the generating step.

17. The method of claim 15 wherein the generating step comprises combining the feedback signal and the amplitude component of the polar modulation at an integrator to create the control signal, and wherein the time constant of the integrator is adjustable with the discrete steps of the baseband gain to maintain a substantially constant loop gain of the feedback signal.

18. A circuit configured to execute the method of claim 15.

19. A system for applying a polar modulation having a phase component and an amplitude component to a power amplifier (PA) having an amplifier gain stage, wherein the power amplifier is configured to amplify an input to create an amplifier output signal, the system comprising:

open control loop means for providing the phase component of the polar modulation to the power amplifier;

means for receiving an indication of an amplifier output amplitude as a feedback signal;

means for generating a control signal based upon both the feedback signal and the amplitude component of the polar bias modulation; and means for adjusting a bias signal associated with the amplifier gain stage in response to the control signal.

\* \* \* \* \*